(12) United States Patent
Qiu (10) Patent No.: US 9,470,833 B1
(45) Date of Patent: Oct. 18, 2016

(54) BACKLIGHT MODULE AND BACKLIGHT SYSTEM USING SAME

(71) Applicant: SHENZHEN CHINA STAR OPTOELECTRONICS TECHNOLOGY CO., LTD., Shenzhen, Guangdong (CN)

(72) Inventor: Yongyuan Qiu, Guangdong (CN)

( * ) Notice: Subject to any disclaimer, the term of this patent is extended or adjusted under 35 U.S.C. 154(b) by 0 days.

(21) Appl. No.: 14/370,292

(22) PCT Filed: Dec. 24, 2013

(86) PCT No.: PCT/CN2013/090376
§ 371 (c)(1),
(2) Date: Jul. 2, 2014

(87) PCT Pub. No.: WO2015/078076
PCT Pub. Date: Jun. 4, 2015

(30) Foreign Application Priority Data

Nov. 26, 2013 (CN) .......................... 2013 1 0613076

(51) Int. Cl.
*H01L 31/042* (2014.01)
*F21V 8/00* (2006.01)
(Continued)

(52) U.S. Cl.
CPC ............ *G02B 6/0023* (2013.01); *G02B 6/0008* (2013.01); *G02B 6/0028* (2013.01); *G02B 6/0068* (2013.01); *H05B 33/0854* (2013.01); *H05B 33/0869* (2013.01); *H05B 37/0218* (2013.01); *H01L 31/055* (2013.01); *H01L 35/30* (2013.01)

(58) Field of Classification Search
CPC ........... H01L 31/0547; H01L 31/0543; H01L 31/054; H01L 31/055; H01L 31/0525; H01L 35/30

USPC ................ 136/206, 205, 207, 243, 244, 246
See application file for complete search history.

(56) References Cited

U.S. PATENT DOCUMENTS

2009/0277495 A1\* 11/2009 Talaba .................... H02S 40/38
136/246
2010/0229854 A1\* 9/2010 Martin-Lopez .......... F24J 2/067
126/698

(Continued)

FOREIGN PATENT DOCUMENTS

CN      101004512 A    7/2007
CN      101782698 A    7/2010

(Continued)

OTHER PUBLICATIONS

Xijie Chen, the International Searching Authority written comments, Sep. 2014, CN.

*Primary Examiner* — Tuyet Vo (57) ABSTRACT

The present invention discloses a backlight module including a solar collector, a number of fibers, a light bar, an optical mixing block and a light guide plate. Each of the fibers includes a light incident end and a light output end. The solar light collector traces the sun and collects the solar light. The light incident ends are connected to the solar light collector and transmits the collected solar light to the light output end. The light bar includes a number of point light sources. The point light sources and the light output ends of the fibers are set on the light bar. The solar light collected by the solar light collector enters the optical mixing block to mix via the light output ends of the fibers and emits into the light guide plate to be spread as an even surface light source.

16 Claims, 5 Drawing Sheets

(51) Int. Cl.
*H05B 37/02* (2006.01)
*H05B 33/08* (2006.01)
*H01L 31/055* (2014.01)
*H01L 35/30* (2006.01)

(56) References Cited

U.S. PATENT DOCUMENTS

2011/0247679 A1\* 10/2011 Shelef ........................ F24J 2/07
   136/246
2016/0173027 A1\* 6/2016 Davoren ................ H02S 40/34
   136/244

FOREIGN PATENT DOCUMENTS

| | | |
|---|---|---|
| CN | 102193247 A | 9/2011 |
| CN | 102494297 A | 6/2012 |
| CN | 102913849 A | 2/2013 |
| CN | 102927524 A | 2/2013 |
| CN | 102943975 A | 2/2013 |
| CN | 102966910 A | 3/2013 |
| CN | 102966912 A | 3/2013 |
| CN | 102966913 A | 3/2013 |
| CN | 103047614 A | 4/2013 |
| JP | 2005091494 A | 4/2005 |
| TW | 200510877 A | 3/2005 |

\* cited by examiner

BACKLIGHT MODULE AND BACKLIGHT SYSTEM USING SAME

FIELD OF THE INVENTION

The invention relates to a backlight module and a backlight system using same.

BACKGROUND OF THE INVENTION

A current liquid crystal display usually employs a number of light emitting diodes (LEDs) as a backlight module. However, the LED is an electroluminescent device and wastes a lot of energy for a long time use. Nature sunlight is environmental free energy and should be considered being used as a backlight resource of liquid crystal display. However, solar energy is not available at night or in cloudy days and the color temperature of sunlight is 6000K, far from a color temperature range of normal backlight resource from 10000K to 20000K, which influences a display effect.

Therefore, it is desirable to provide a means which can solve the above-mentioned problems.

SUMMARY OF THE INVENTION

To solve the above-mentioned problem, the present invention provides a backlight module including a solar collector, a number of fibers, a light bar, an optical mixing block and a light guide plate. Each of the fibers includes a light incident end and a light output end. The solar light collector traces the sun and collects the solar light. The light incident ends are connected to the solar light collector and transmits the collected solar light to the light output end. The light bar includes a number of point light sources. The point light sources and the light output ends of the fibers are set on the light bar. The solar light collected by the solar light collector enters the optical mixing block to mix via the light output ends of the fibers and emits into the light guide plate to be spread as an even surface light source. The point light sources give out a light to compensate lacks of chromaticity and brightness of the collected solar light.

Wherein the point light sources and the light output ends of the fibers are alternately set on the light bar along a longitudinal direction of the light bar.

Wherein an arrangement of the point light sources is alternately spaced blue point light sources and white point light sources.

Wherein an arrangement of the point light sources is orderly spaced red point light sources, green point light sources, and blue point light sources.

Wherein the optical mixing block includes a light incident surface, a light output surface, and a refection surface connecting the light incident surface and the light output surface. The light come out from the point light source and the light output end of the fiber enters into the optical mixing block via the light incident surface. The light strike on the reflection surface from inside of the optical mixing block is reflected back into the optical mixing block.

Wherein the optical mixing block is a orthogonal trapezoidal quadrangular which includes an upper surface, a lower surface parallel to the upper surface and similar to the upper surface in shape, a front surface, a back surface parallel to the front surface but having different size with the front surface, an incline side surface obliquely connecting with the front surface and the back surface, and a rear surface perpendicularly connecting with the front surface and the back surface. The back surface is functional as the light incident surface. The rear surface is functional as the light output surface, the upper surface. The lower surface, the front surface and the incline side surface are functional as the reflection surface. The rear surface faces a incident side of the light guide plate, and a light emitting direction of the point light source and the light output end of the fiber on the light bar faces the back surface.

Wherein the optical mixing block is an orthogonal triangular prism which includes a pair of rectangular side walls perpendicular to each other, a rectangular incline side wall obliquely connected to the rectangular side walls and a pair of triangular side walls correspondingly perpendicularly connected to the rectangular side walls and the incline side wall. The incline side wall is divided into an upper light output area and a lower light incident area, the incident surface of the light guide plate corresponds to the light output area. A width of the light output area is the same as the thickness of the light guide plate. The light guide plate is perpendicular to the incline side wall, the light bar is set below the light guide plate. A light emitting direction of the light bar is aligned with the light incident area of the incline side wall, the rectangular side walls and the triangular side walls are function as the reflection surface.

A backlight system includes a backlight module and a controlling module to control the backlight module. The backlight module including a solar collector, a number of fibers, a light bar, an optical mixing block and a light guide plate. Each of the fibers includes a light incident end and a light output end. The solar light collector traces the sun and collects the solar light. The light incident ends are connected to the solar light collector and transmits the collected solar light to the light output end. The light bar includes a number of point light sources. The point light sources and the light output ends of the fibers are set on the light bar. The solar light collected by the solar light collector enters the optical mixing block to mix via the light output ends of the fibers and emits into the light guide plate to be spread as an even surface light source. The point light sources give out a light to compensate lacks of chromaticity and brightness of the collected solar light. The controlling module includes a setting unit, a detecting unit, a comparing unit, and a regulating unit. The setting module set chromaticity coordinates of backlight, a brightness standard value and error ranges of the chromaticity coordinates and the brightness standard value. The detecting unit detects chromaticity coordinates and brightness value of the light from the light guide plate. The comparing unit compares a threshold of the error range of the chromaticity coordinates with the chromaticity coordinates of the light from the light guide plate and compares a threshold of the error range of the standard brightness value with the brightness value of the light from the light guide plate. The regulating unit controls the color of the point light source to shine according to the comparison between the chromaticity coordinates of the light from the light guide plate and the preset error range of the chromaticity coordinates to compensate the chromaticity deviation of the solar light and controls the brightness of the point light source according to the comparison between the brightness of the light from the light guide plate and the standard brightness value to compensate lack of brightness of the solar light.

Wherein the chromaticity coordinates is (0.28, 0.29), and the error range of the chromaticity coordinates is (0.28+0.05, 0.29+0.05).

Wherein the brightness standard value is 5000 nits, and the error range of the brightness standard value is +5%.

Wherein the point light sources and the light output ends of the fibers are alternately set on the light bar along a longitudinal direction of the light bar.

Wherein an arrangement of the point light sources is alternately spaced blue point light sources and white point light sources.

Wherein an arrangement of the point light sources is orderly spaced red point light sources, green point light sources, and blue point light sources.

Wherein the optical mixing block includes a light incident surface, a light output surface, and a refection surface connecting the light incident surface and the light output surface, the light come out from the point light source and the light output end of the fiber enters into the optical mixing block via the light incident surface, and the light strike on the reflection surface from inside of the optical mixing block is reflected back into the optical mixing block.

Wherein the optical mixing block is a orthogonal trapezoidal quadrangular which includes an upper surface, a lower surface parallel to the upper surface and similar to the upper surface in shape, a front surface, a back surface parallel to the front surface but having different size with the front surface, an incline side surface obliquely connecting with the front surface and the back surface, and a rear surface perpendicularly connecting with the front surface and the back surface. The back surface is functional as the light incident surface. The rear surface is functional as the light output surface, the upper surface. The lower surface, the front surface and the incline side surface are functional as the reflection surface. The rear surface faces a incident side of the light guide plate, and a light emitting direction of the point light source and the light output end of the fiber on the light bar faces the back surface.

Wherein the optical mixing block is an orthogonal triangular prism which includes a pair of rectangular side walls perpendicular to each other, a rectangular incline side wall obliquely connected to the rectangular side walls and a pair of triangular side walls correspondingly perpendicularly connected to the rectangular side walls and the incline side wall. The incline side wall is divided into an upper light output area and a lower light incident area, the incident surface of the light guide plate corresponds to the light output area. A width of the light output area is the same as the thickness of the light guide plate. The light guide plate is perpendicular to the incline side wall, the light bar is set below the light guide plate. A light emitting direction of the light bar is aligned with the light incident area of the incline side wall, the rectangular side walls and the triangular side walls are function as the reflection surface.

The backlight system of the embodiments of the present invention employs the collected sunlight as backlight, with a help of blue point light sources to compensate blue lack of the sunlight and make use of white point light source to compensate a brightness of the sunlight. Thus, the energy is saved with a good backlight quality.

BRIEF DESCRIPTION OF THE DRAWINGS

In order to illustrate technical schemes of the present invention or the prior art more clearly, the following section briefly introduces drawings used to describe the embodiments and prior art. Obviously, the drawing in the following descriptions just is some embodiments of the present invention. The ordinary person in the related art can acquire the other drawings according to these drawings without offering creative effort.

DETAILED DESCRIPTION OF THE PREFERRED EMBODIMENTS

The following sections offer a clear, complete description of the present invention in combination with the embodiments and accompanying drawings. Obviously, the embodiments described herein are only a part of, but not all of the embodiments of the present invention. In view of the embodiments described herein, any other embodiment obtained by the person skilled in the field without offering creative effort is included in a scope claimed by the present invention.

Figure 1:
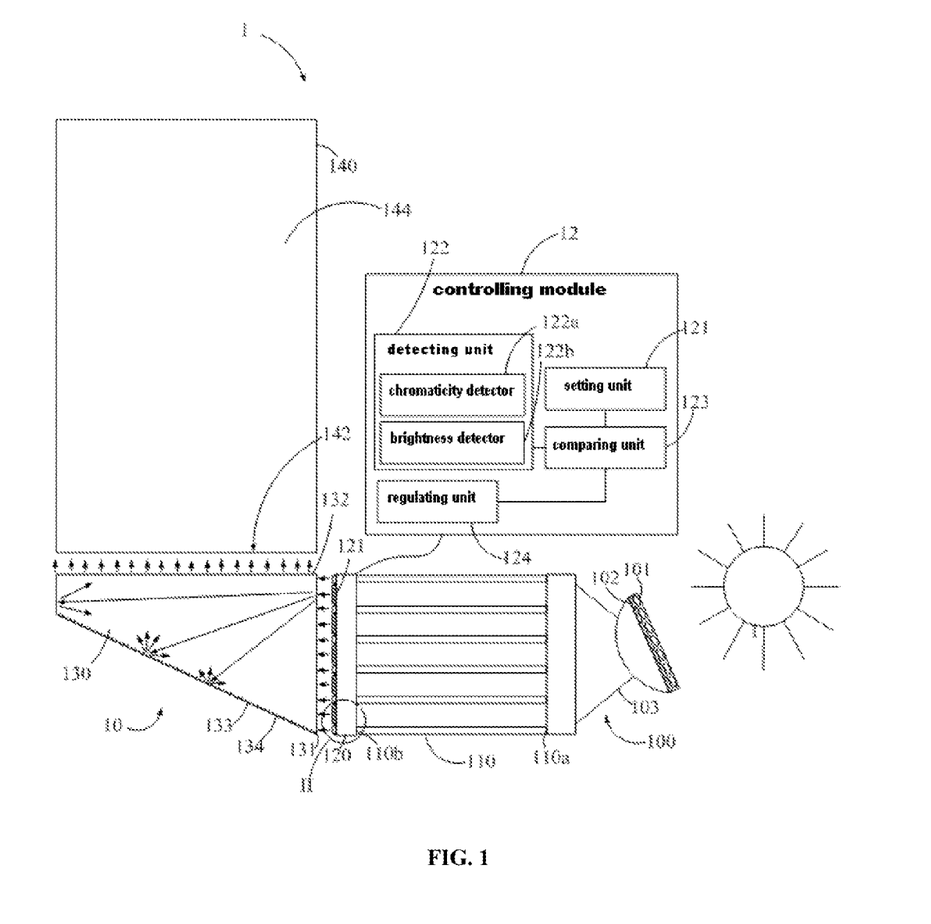
FIG. 1 is a schematic structural view of a backlight system in accordance with a first embodiment of the present invention.

Referring to FIG. 1, a backlight system provided by a first embodiment of the present invention includes a backlight module 10 and a controlling module 12 used to control the backlight module 10. The backlight module 10 includes a solar light collector 100, a number of fibers 110, a light bar 120, an optical mixing block 130, and a light guide plate 140. Each of the fiber 110 includes a light incident end 110a and a light output end 110b opposite to the light incident end 110a. The solar light collector 100 traces the sun and collects the solar light. The light incident end 110a is connected to the solar light collector 100 for transmitting the solar light to the light output end 110b. There are a number of point light sources 121 and the light output ends 110b of the fibers 110 set on the light bar 120. The solar light collected by the solar light collector 100 emits into the optical mixing block 130 to mixture and then enters the light guide plate 140 to be spread as a surface light source. The controlling module 12 controls the point light sources 121 to give out the light to compensate lacks of chromaticity and brightness of the collected solar light.

The solar collector 100 includes a lens group 101, a light sensor 102, and a driving device 103. The lens group 101 is used to converge the solar light. The light sensor 102 senses an orientation of the sun according to the collected solar light. The driving device 103 drives the lens group to face the sun according to the orientation of the sun. The light incident ends 110a of the fibers 110 is connected with the lens group 101 to transmit the collected light to the optical mixing block 130. The light sensor 102 determines the orientation of the sun according to a shadow of a mark on which the sun shines or an energy distribution of the sun on a predetermined plane. The principle and embodiment of the light sensor 102 is not recited here in detail.

Figure 2:
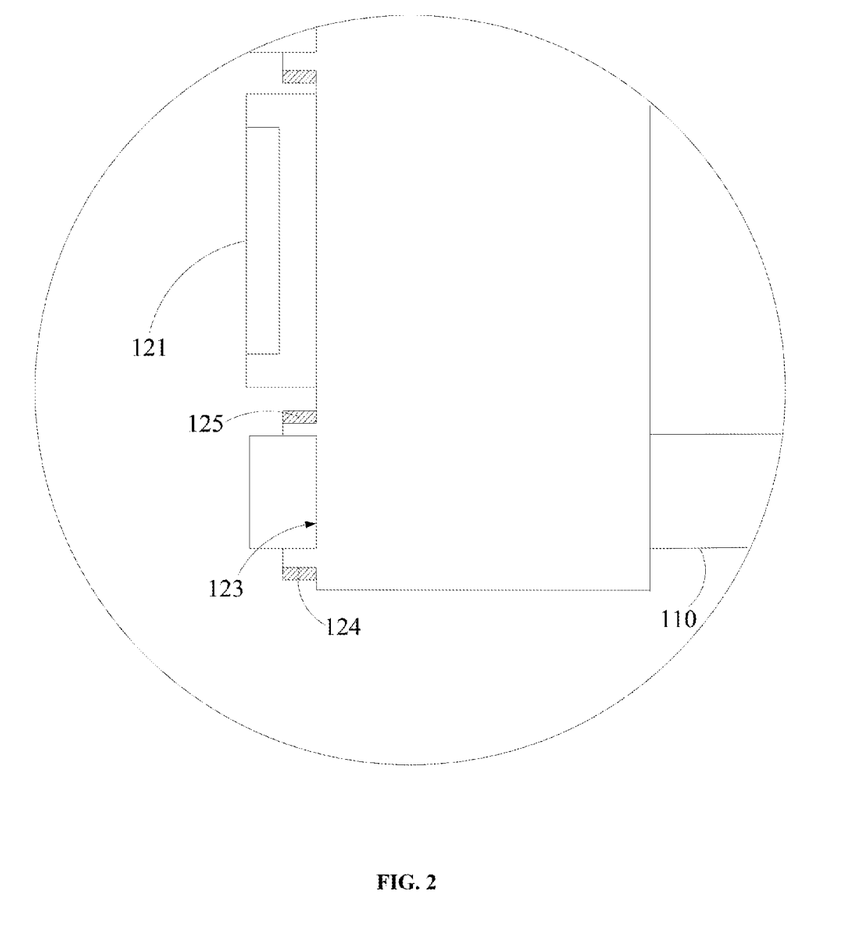
FIG. 2 is an enlarged view of II portion of FIG. 1.

Also referring to FIG. 2, the point light sources 121 and the light output ends 110b of the fibers 110 are alternately set on the light bar 120 along a longitudinal direction of the light bar 120. The light bar 120 defines a number of receiving through holes 123 between each two adjacent point light sources 121. A periphery of each receiving through hole 123 at a light emitting side of the point light sources 121 extends out a pair of receiving side walls 124. The light bar 120 clamps the light output end 110b of the fiber 110 received between the receiving side walls 124 by screwing a nut on an outer surface of the receiving side walls 124. An arrangement of the point light sources 121 may be, but is not limited to, alternately spaced blue point light sources 121 and white point light sources 121, or orderly spaced red point light sources 121, green point light sources 121, and blue point light sources 121. In this embodiment, the arrangement of the point light source 121 is alternately spaced blue point light sources 121 and white light sources 121.

In this embodiment, the point light sources 112 are a number of light emitting diodes (LEDs). It is understood that, in an alternative embodiment, the point light sources 121 also may be, a number of organic light emitting diodes (OLEDs) and a number of lamps.

The optical mixing block 130 includes a light incident surface 131, a light output surface 132, and a refection surface 133 connecting the light incident surface 131 and the light output surface 132. The light come out from the point light source 121 and the light output end 132 of the fiber 110 enters into the optical mixing block 130 via the light incident surface 131. A reflector or a reflecting layer with high reflectivity is set on the light output surface 133. The light output surface 133 also includes a number of micro scattering structures 134 formed thereon to scatter the light, such as a number of concave dots arranged as a matrix. The micro scattering structures 134 on the reflection surface 133 scatter the light to different direction when reflects the light back into the optical mixing block 130. The light is evenly mixed in the optical mixing block 130, and then is emitted out from the light output surface 132. The optical mixing block 130 is made of a material has good translucency, such as polymethyl methacrylate (PMMA).

Figure 3:
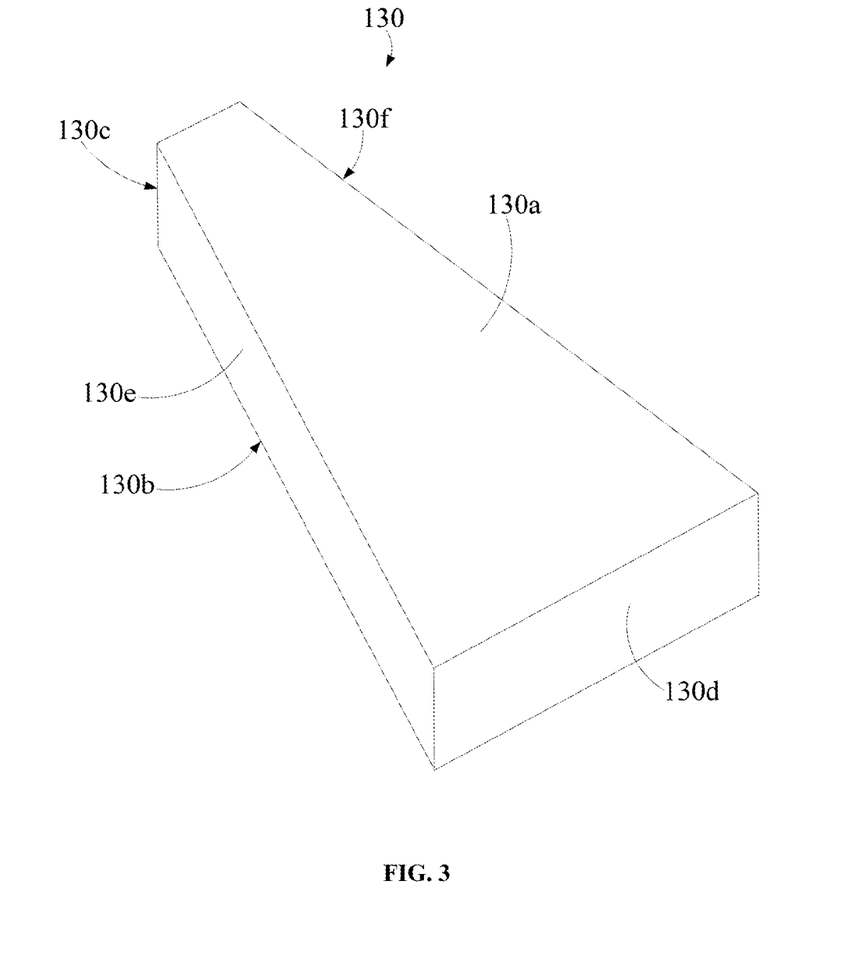
FIG. 3 is a schematic structural view of an optical mixing block of FIG. 1.

Also referring to FIG. 3, in this embodiment, the optical mixing block 130 is a orthogonal trapezoidal quadrangular which includes an upper surface 130a, a lower surface 130b parallel to the upper surface 130a and similar to the upper surface 130a in shape, a front surface 130c, a back surface 130d parallel to the front surface 130c but having different size with the front surface 130c, an incline side surface 130e obliquely connecting with the front surface 130c and the back surface 130d, and a rear surface 130f perpendicularly connecting with the front surface 130c and the back surface 130d. The back surface 130d is functional as the light incident surface 131. The rear surface 130f is functional as the light output surface 132. The other surfaces are functional as the reflection surface 133. The micro scattering structures 134 are set on the incline side surface 130e. Because the incline side surface 130e located before the back surface 130d, most of light entered from the back surface 130d is scattered by the micro scattering structure 134 when is reflected by the incline side surface 130e to mix the light evenly. The light strikes on the upper surface 130a, the lower surface 130b and the front surface 130c are all reflected back into the optical mixing block unit come out from the rear surface 130f.

It is understood that the light incident surface 131 is not limited to the back surface 130d of the orthogonal trapezoidal quadrangular and may be the other surfaces, such as the optical mixing block 130 includes two light incident surfaces 131 of the front surface 130c and the back surface 130d, or includes three light incident surfaces 131 of the front surface 130c, the back surface 130d and the incline surface 130e. Each of the light incident surfaces 131 is correspond to one light bar 120 to provide the incident light source.

The light output surface 132 of the optical mixing block 130 faces the light incident side of the light guide plate 140. A light emitting direction of the point light source 121 and the light output end 110b of the fiber 110 on the light bar 120 faces the light incident surface 131 of the optical mixing block 130. In this embodiment, the light emitting direction of the light bar 120 is perpendicular to a normal line of the light output surface 132. That is, a light path of the backlight module 10 is the light from the light bar 120 is turned 90 degrees by the optical mixing block 130 and then enters into the light guide plate 140.

The light guide plate 140 includes an incident surface 142 and an output surface 144. The incident surface 142 is similar to the light output surface 132 of the optical mixing block 130 in shape and size to accept as much as possible light from the light come out from the optical mixing block 130. The light guide plate 140 may be a rectangular plate with a stable thickness or a wedge with the thickness gradually reducing from one end to the other end. In this embodiment, the light guide plate 140 is the rectangular plate with the stable thickness. A side wall corresponding to one of short side is the incident surface 142. A top surface perpendicular to the side wall is the output surface 144.

The controlling module 12 includes a setting unit 121, a detecting unit 122, a comparing unit 123 and a regulating unit 124. The word "module", as used therein, refers to logic embodied in hardware or firmware, or to a collection of software instructions, written in a programming language. The software instructions may be embedded in firmware or stored in any type of storage device and executed by a processor to implement a particular function.

The setting unit 121 sets chromaticity coordinates of backlight, a brightness standard value and error ranges of the chromaticity coordinates and the brightness standard value. The chromaticity coordinates, the brightness standard value and the corresponding error ranges is used as a reference to regulate the light from the point light source 121. In this embodiment, the chromaticity coordinates is (0.28, 0.29), the error range of the chromaticity coordinates is (0.28+0.05, 0.29+0.05). The brightness standard value is 5000 nits. The error range of the brightness standard value is +5%.

The detecting unit 122 includes a chromaticity detector 122a and a brightness detector 122b. The chromaticity detector 122a and the brightness detector 122b are set beside the output surface 144 of the light guide plate 140 to detect the chromaticity coordinates and the brightness of the light from the light guide plate 140. Because nature sunlight lacks of blue wave band, in order to meet a chromaticity requirement of the backlight, the point light sources 121 needs to give out blue light to regulate the collected sunlight. At night or in a cloudy day, the brightness of the collected sunlight also cannot meet the display requirement, and the point light source 121 needs to give out white light to compensate the brightness of the collected sunlight. The chromaticity coordinates and the brightness value of the light from the light guide plate 140 is used as a parameter to regulate the lighting of the point light source 121.

The comparing unit 123 compares a threshold of the error range of the chromaticity coordinates with the chromaticity coordinates of the light from the light guide plate 140 to determine how much lack of blue light in the light from the light guide plate 140. The comparing unit 123 compares a threshold of the error range of the standard brightness value with the brightness value of the light from the light guide plate 140 to determine whether or not the brightness of the light from the light guide plate 140 meet the brightness requirement of the backlight.

The regulating unit 124 controls the blue point light source 121 to shine according to the comparison between the chromaticity coordinates of the light from the light guide plate 140 and the preset error range of the chromaticity coordinates. If the chromaticity coordinates of the light from the light guide plate 140 is within the error range of the chromaticity coordinates, the regulating unit 124 transmits a turn off instruction to the light bar 120 to turn off the blue point light source 121. If the chromaticity coordinates of the light from the light guide plate 140 is out of the error range of the chromaticity coordinates towards a direction of blue side, the regulating unit 121 transmits a compensating instruction to the light bar 120 to turn on the blue point light source to compensate the blue light. The chromaticity coordinates of the output light deviate further from the error range, and the blue point light source is controlled to shine brighter to increase the compensation strength of blue light. The regulating unit 124 controls the white point light source 121 to shine according to the comparison between the brightness of the light from the light guide plate 140 and the standard brightness value. If the brightness of the light from the light guide plate 140 is less than a minimum value of the error range of the standard brightness value, the regulating unit 124 transmits a brightness compensating instruction to the light bar 120 to turn on the white point light source 121 for compensating the backlight brightness. It is understood that if the arrangement of the point light sources 121 is alternately spaced the red point light source 121, the green point light source 121 and the blue point light source 121, the light bar 120 turns on the red point light source 121, the green point light source 121 and the blue point light source 121 at a same time when receives the brightness compensating instruction.

Figure 4:
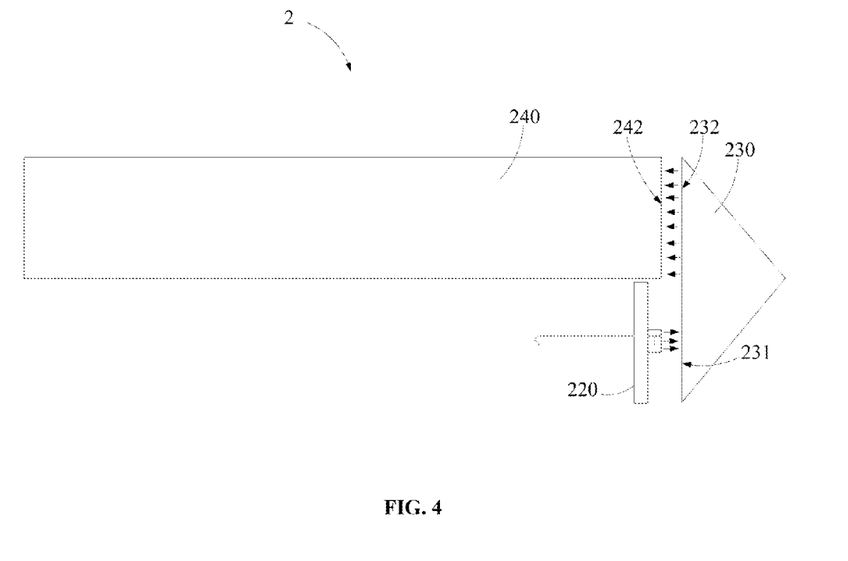
FIG. 4 is a schematic structural view of a backlight system in accordance with a second embodiment of the present invention.
Figure 5:
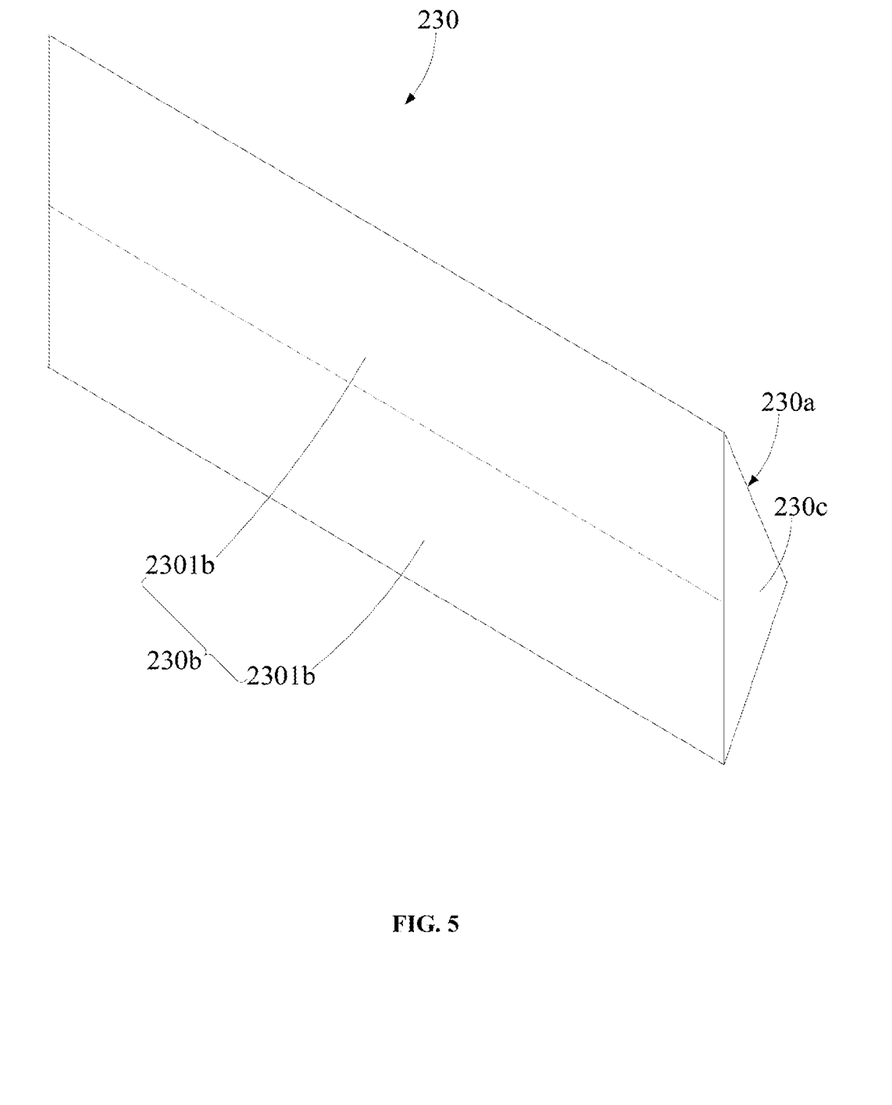
FIG. 5 is a schematic structural view of an optical mixing block of FIG. 4.

Referring to FIGS. 4 and 5, a structure of a backlight system in accordance with a second embodiment of the present invention is similar to that of the backlight system 1 of the first embodiment with a difference that the optical mixing block 230 is an orthogonal triangular prism. The optical mixing block 230 includes a pair of rectangular side walls 230a perpendicular to each other, a rectangular incline side wall 230b obliquely connected to the rectangular side walls 230a and a pair of triangular side walls 230c correspondingly perpendicularly connected to the rectangular side walls 230a and the incline side wall 230b. The incline side wall 230b is divided into an upper light output area 2300b and a lower light incident area 2301b along a direction perpendicular to the lateral edge. The light output area 2300b is functional as the light output surface 232 of the optical mixing block 230. The light incident area 2301b is functional as the light incident surface 231 of the optical mixing block 230. The incident surface 242 of the light guide plate 240 corresponds to the light output area 2300b. A width of the light output area 2300b is the same as the thickness of the light guide plate 240. The light guide plate 240 is perpendicular to the incline side wall 230b. The light bar 220 is set below the light guide plate 240. A light emitting direction of the light bar 220 is aligned with the light incident area 2301b of the incline side wall 230b. The rectangular side walls 230 and the triangular side walls 230 are function as the reflection surface 133.

The backlight system 1 of the embodiments of the present invention employs the collected sunlight as backlight, with a help of blue point light sources 121 to compensate blue lack of the sunlight and make use of white point light source 121 to compensate a brightness of the sunlight. Thus, the energy is saved with a good backlight quality.

What is said above are only preferred examples of present invention, not intended to limit the present invention, any modifications, equivalent substitutions and improvements etc. made within the spirit and principle of the present invention, should be included in the protection range of the present invention.

What is claimed is:

1. A backlight module, comprising:
   a solar light collector tracing the sun and collecting the solar light;
   a plurality of fibers, each of the fibers comprising a light incident end connecting the solar light collector and a light output end, the light incident end transmitting the collected solar light to the light output end;
   a light bar comprising a plurality of point light sources;
   a optical mixing block; and
   a light guide plate;
   wherein the point light sources and the light output ends of the fibers are set on the light bar, the solar light collected by the solar light collector enters the optical mixing block to mix via the light output ends of the fibers and emits into the light guide plate to be spread as a even surface light source, and the point light sources give out a light to compensate lacks of chromaticity and brightness of the collected solar light.

2. The backlight module of claim 1, wherein the point light sources and the light output ends of the fibers are alternately set on the light bar along a longitudinal direction of the light bar.

3. The backlight module of claim 2, wherein an arrangement of the point light sources is alternately spaced blue point light sources and white point light sources.

4. The backlight module of claim 2, wherein an arrangement of the point light sources is orderly spaced red point light sources, green point light sources, and blue point light sources.

5. The backlight module of claim 1, wherein the optical mixing block comprises a light incident surface, a light output surface, and a refection surface connecting the light incident surface and the light output surface, the light come out from the point light source and the light output end of the fiber enters into the optical mixing block via the light incident surface, and the light strike on the reflection surface from inside of the optical mixing block is reflected back into the optical mixing block.

6. The backlight module of claim 5, wherein the optical mixing block is a orthogonal trapezoidal quadrangular which comprises an upper surface, a lower surface parallel to the upper surface and similar to the upper surface in shape, a front surface, a back surface parallel to the front surface but having different size with the front surface, an incline side surface obliquely connecting with the front surface and the back surface, and a rear surface perpendicularly connecting with the front surface and the back surface, the back surface is functional as the light incident surface, the rear surface is functional as the light output surface, the upper surface, the lower surface, the front surface and the incline side surface are functional as the reflection surface, the rear surface faces a incident side of the light guide plate, and a light emitting direction of the point light source and the light output end of the fiber on the light bar faces the back surface.

7. The backlight module of claim 5, wherein the optical mixing block is an orthogonal triangular prism which comprises a pair of rectangular side walls perpendicular to each other, a rectangular incline side wall obliquely connected to the rectangular side walls and a pair of triangular side walls correspondingly perpendicularly connected to the rectangular side walls and the incline side wall, the incline side wall is divided into an upper light output area and a lower light incident area, the incident surface of the light guide plate corresponds to the light output area, a width of the light output area is the same as the thickness of the light guide plate, the light guide plate is perpendicular to the incline side wall, the light bar is set below the light guide plate, a light emitting direction of the light bar is aligned with the light incident area of the incline side wall, the rectangular side walls and the triangular side walls are function as the reflection surface.

8. A backlight system comprising:
a backlight module comprising:
a solar light collector tracing the sun and collecting the solar light;
a plurality of fibers, each of the fibers comprising a light incident end connecting the solar light collector and a light output end, the light incident end transmitting the collected solar light to the light output end;
a light bar comprising a plurality of point light sources;
a optical mixing block; and
a light guide plate;
wherein the point light sources and the light output ends of the fibers are set on the light bar, the solar light collected by the solar light collector enters the optical mixing block to mix via the light output ends of the fibers and emits into the light guide plate to be spread as a even surface light source, and the point light sources give out a light to compensate lacks of chromaticity and brightness of the collected solar light; and
a controlling module comprising:
a setting unit setting chromaticity coordinates of backlight, a brightness standard value and error ranges of the chromaticity coordinates and the brightness standard value;
a detecting unit detecting chromaticity coordinates and brightness value of the light from the light guide plate;
a comparing unit comparing a threshold of the error range of the chromaticity coordinates with the chromaticity coordinates of the light from the light guide plate and comparing a threshold of the error range of the standard brightness value with the brightness value of the light from the light guide plate; and
a regulating unit controlling the color of the point light source to shine according to the comparison between the chromaticity coordinates of the light from the light guide plate and the preset error range of the chromaticity coordinates to compensate the chromaticity deviation of the solar light and controlling the brightness of the point light source according to the comparison between the brightness of the light from the light guide plate and the standard brightness value to compensate lack of brightness of the solar light.

9. The backlight system of claim 8, wherein the chromaticity coordinates is (0.28, 0.29), and the error range of the chromaticity coordinates is (0.28+0.05, 0.29+0.05).

10. The backlight system of claim 8, wherein the brightness standard value is 5000 nits, and the error range of the brightness standard value is ±5%.

11. The backlight system of claim 8, wherein the point light sources and the light output ends of the fibers are alternately set on the light bar along a longitudinal direction of the light bar.

12. The backlight system of claim 11, wherein an arrangement of the point light sources is alternately spaced blue point light sources and white point light sources.

13. The backlight system of claim 11, wherein an arrangement of the point light sources is orderly spaced red point light sources, green point light sources, and blue point light sources.

14. The backlight system of claim 8, wherein the optical mixing block comprises a light incident surface, a light output surface, and a refection surface connecting the light incident surface and the light output surface, the light come out from the point light source and the light output end of the fiber enters into the optical mixing block via the light incident surface, and the light strike on the reflection surface from inside of the optical mixing block is reflected back into the optical mixing block.

15. The backlight system of claim 14, wherein the optical mixing block is a orthogonal trapezoidal quadrangular which comprises an upper surface, a lower surface parallel to the upper surface and similar to the upper surface in shape, a front surface, a back surface parallel to the front surface but having different size with the front surface, an incline side surface obliquely connecting with the front surface and the back surface, and a rear surface perpendicularly connecting with the front surface and the back surface, the back surface is functional as the light incident surface, the rear surface is functional as the light output surface, the upper surface, the lower surface, the front surface and the incline side surface are functional as the reflection surface, the rear surface faces a incident side of the light guide plate, and a light emitting direction of the point light source and the light output end of the fiber on the light bar faces the back surface.

16. The backlight system of claim 14, wherein the optical mixing block is an orthogonal triangular prism which comprises a pair of rectangular side walls perpendicular to each other, a rectangular incline side wall obliquely connected to the rectangular side walls and a pair of triangular side walls correspondingly perpendicularly connected to the rectangular side walls and the incline side wall, the incline side wall is divided into an upper light output area and a lower light incident area, the incident surface of the light guide plate corresponds to the light output area, a width of the light output area is the same as the thickness of the light guide plate, the light guide plate is perpendicular to the incline side wall, the light bar is set below the light guide plate, a light emitting direction of the light bar is aligned with the light incident area of the incline side wall, the rectangular side walls and the triangular side walls are function as the reflection surface.

* * * * *